United States Patent [19]
Emmons

[11] Patent Number: 5,243,430
[45] Date of Patent: Sep. 7, 1993

[54] REMOTE CONTROL APPARATUS AND METHOD FOR OMNIDIRECTIONAL SIGNAL TRANSMISSION

[75] Inventor: Lawrence D. Emmons, Grass Valley, Calif.

[73] Assignee: Mitsubishi Electronics America, Inc., Cypress, Calif.

[21] Appl. No.: 735,380

[22] Filed: Jul. 24, 1991

[51] Int. Cl.$^5$ .............................................. H04N 5/44
[52] U.S. Cl. ......................... 358/194.1; 340/825.57; 340/825.69; 359/42; 455/151.1
[58] Field of Search ................. 358/194.1; 359/142, 359/146, 147, 148, 159, 172; 455/151; 340/825.69, 825.72, 825.57

[56] References Cited

U.S. PATENT DOCUMENTS

| | | |
|---|---|---|
| D. 219,028 | 10/1970 | Miller et al. . |
| D. 266,416 | 10/1982 | Hiraki . |
| D. 298,942 | 12/1988 | Pieratt . |
| D. 300,831 | 4/1989 | Jenkins et al. . |
| 2,345,472 | 3/1944 | Goldsmith . |
| 2,920,604 | 1/1960 | McDonald, Jr. . |
| 3,294,901 | 12/1966 | Stanghi . |
| 3,325,593 | 6/1967 | Platt et al. . |
| 3,440,427 | 4/1969 | Kammer . |
| 3,866,177 | 2/1975 | Kawamata et al. . |
| 3,928,760 | 12/1975 | Isoda . |
| 4,036,762 | 7/1977 | Troetscher et al. . |
| 4,045,777 | 8/1977 | Mierzwinski et al. . |
| 4,078,257 | 3/1978 | Bagley . |
| 4,091,272 | 5/1978 | Richter et al. . |
| 4,111,421 | 9/1978 | Mierzwinski et al. . |
| 4,169,226 | 9/1979 | Fukuji . |
| 4,185,282 | 1/1980 | Pick . |
| 4,231,031 | 10/1980 | Crowther et al. . |
| 4,264,896 | 4/1981 | Sakarya et al. . |
| 4,274,093 | 6/1981 | Judge . |
| 4,322,855 | 3/1982 | Mogi et al. . |
| 4,482,947 | 11/1984 | Zato et al. . |
| 4,549,179 | 10/1985 | Stendardo . |
| 4,566,034 | 1/1986 | Harger et al. . |
| 4,623,887 | 11/1986 | Welles, II . |
| 4,626,847 | 12/1986 | Zato . |
| 4,626,848 | 12/1986 | Ehlers . |
| 4,703,359 | 10/1987 | Rumbolt et al. . |
| 4,709,412 | 11/1987 | Seymour et al. . |
| 4,712,105 | 12/1987 | Kohler . |
| 4,728,949 | 3/1988 | Platte et al. . |
| 4,746,919 | 5/1988 | Reitmeier . |
| 4,769,643 | 9/1988 | Sogame . |
| 4,771,283 | 9/1988 | Imoto . |
| 4,774,511 | 9/1988 | Rumbolt et al. . |
| 4,802,114 | 1/1989 | Sogame . |
| 4,807,052 | 2/1989 | Amano . |
| 4,823,311 | 4/1989 | Hunter et al. . |
| 4,825,200 | 4/1989 | Evans et al. . |
| 4,844,637 | 7/1989 | Buisson et al. . |
| 4,856,081 | 8/1989 | Smith . |
| 4,857,898 | 8/1989 | Smith . |
| 4,866,434 | 9/1989 | Keenan . |
| 4,878,055 | 10/1989 | Kasahara . |
| 4,905,279 | 2/1990 | Nishio .............................. 358/194.1 |
| 5,073,979 | 12/1991 | Webb .................................. 359/142 |

FOREIGN PATENT DOCUMENTS

| | | |
|---|---|---|
| 58-127236 | 7/1983 | Japan . |
| 60-45832 | 3/1985 | Japan . |
| 117833 | 6/1985 | Japan . |
| 71342 | 4/1987 | Japan . |
| 105540 | 5/1988 | Japan . |

OTHER PUBLICATIONS

Hawkins, William J. "No-Aim Remote" Popular Science, Feb. 1988.

Primary Examiner—James J. Groody
Assistant Examiner—Glenton B. Burgess
Attorney, Agent, or Firm—Knobbe, Martens, Olson & Bear

[57] ABSTRACT

An omnidirectional remote control for use with electrically controllable devices. The remote control comprises a keypad input and a program selector for determining control signals to be transmitted by circuitry within the remote control. The remote control further comprises control circuitry which may be used to drive a plurality of transmitting diodes that are spaced around the perimeter of the remote control. The transmitting diodes are spaced so as to provide essentially omnidirectional transmission of control signals.

8 Claims, 2 Drawing Sheets

REMOTE CONTROL APPARATUS AND METHOD FOR OMNIDIRECTIONAL SIGNAL TRANSMISSION

FIELD OF THE INVENTION

The present invention relates to remote control devices which may be used to remotely control television sets and other consumer electronic devices.

BACKGROUND OF THE INVENTION

Remote control devices for controlling television sets and other electronic equipment are well known. Such devices usually transmit a control signal in the infrared frequency spectrum over some distance to a receiver located within the controlled television set. The receiver converts the transmitted radiation into the control signal which controls predetermined operations of the television set.

Typically, a remote control device consists of a data entry key, processing circuitry, and a transmitter. The data entry key may be employed by a user to select a particular control signal to be transmitted, or to program the remote control device by means of the processing circuitry. For example, some remote control devices include push-button keypads as a means for entering data. The processing circuitry within a typical remote control receives input signals from the user by means of the entry key. These input signals are then processed to provide driving signals which drive the transmitter. In some advanced remote control devices, the processing circuitry may be implemented as a microprocessor chip and a memory chip. Commonly, remote control devices transmit control signals in the infrared frequency spectrum, since this frequency of radiation has been found to be an effective means of propagating signals through the air, and it is relatively simple to construct infrared transmitters.

Prior remote control devices have been equipped with an infrared diode, or the like, for transmitting control signals to infrared receivers within electrical apparatuses. The diode is usually mounted on one end of the remote control device so that infrared radiation is transmitted from the end on which the diode is mounted. Thus, in order to transmit a control signal to an electrical apparatus, the remote control device is pointed in the direction of the receiver within the electrical apparatus.

In such devices, it is important that the transmitting end of the remote control be accurately pointed towards the receiver of the electrical apparatus, otherwise, the intensity of the transmitted radiation may not be sufficient to assure proper reception of the control signals. In addition, it is important that no objects are situated in the line-of-sight between the transmitting remote control and the receiver, because such objects may prevent or interfere with the transmission of the control signal.

SUMMARY OF THE INVENTION

The preferred embodiment of the present invention is an omnidirectional remote control device having a plurality of evenly spaced transmitting infrared emitting diodes about its perimeter which provide for essentially omnidirectional transmission of control signals. The remote control broadcasts infrared control signals from a small hand-held control unit over a 360° arc. As a result, unlike prior art controls, the unit need not be pointed at the television set or other piece of electronic equipment being controlled. A significant serendipitous advantage of the invention is that the hand-held transmitter need not generally be situated in a line-of-sight with the remote receiver because the multiple paths of the radiated control signals typically find reflected surfaces to reflect a signal into the receiver.

DETAILED DESCRIPTION OF THE INVENTION

Figure 1:
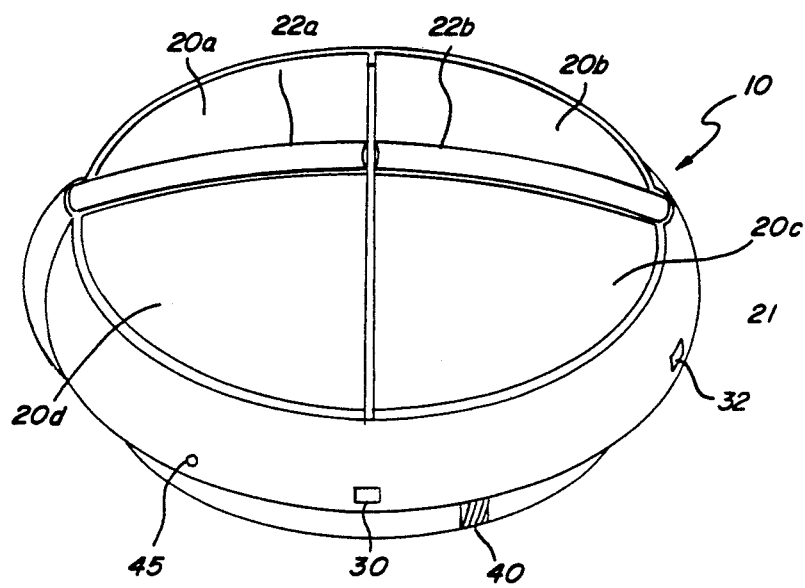
FIG. 1 is a perspective view of the omnidirectional remote control of the present invention.

FIG. 1 is a perspective view of a small hand-held disc-like omnidirectional remote control 10 constructed in accordance with a preferred embodiment of the present invention. In the embodiment shown, the remote control 10 has four input keys or buttons 20a, 20b, 20c and 20d mounted to a housing or case 21 having a generally partial oblate spheroid outer configuration. The keys 20a, 20b, 20c, 20d are advantageously segments of the oblate spheroid and arranged in a circular pattern on the top of the remote control 10, so that each of the keys 20a, 20b, 20c, 20d is formed as a quadrant of the oblate spheroid as shown in FIG. 1. Additional keys 22a and 22b are shown advantageously located within the margins between the respective keys 20a, 20d and 20b, 20c.

Figure 2:
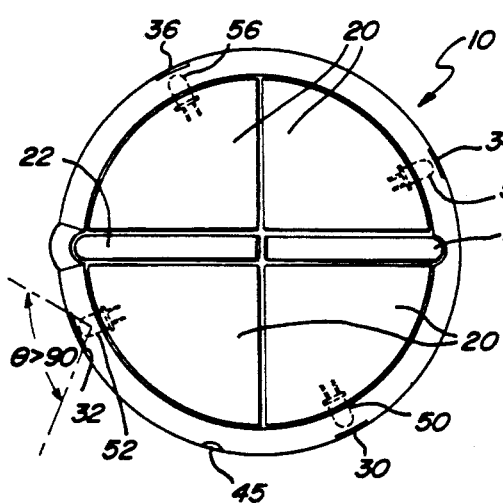
FIG. 2 is a top plan view of the remote control which shows the locations of the transmitting diodes.

The remote control 10 also includes four signal transmission ports 30, 32, 34, 36 (ports 34, 36 are shown in FIG. 2) which are equally spaced around the perimeter of the remote control 10 and located upon two orthogonal axes. Each port is advantageously constructed of a durable material (e.g., transparent or semi-transparent plastic) which efficiently transmits the infrared signals and the like.

The remote control 10 further includes a program select switch 40 for selecting one of a plurality of different transmission modes of the remote control 10. A photoreceptor port 45 is also provided on the perimeter of the remote control 10, and is advantageously constructed of material similar to that of the transmission ports 30, 32, 34, 36. Photo-detector circuitry (FIG. 5) within the remote control 10 is used to detect signals input via the photo-receptor port 45.

The keys 20a, 20b, 20c, 20d, 22a, 22b are used to program the desired control signals and also to program circuitry within the remote control 10. For example, by depressing one key, a user may cause a signal to be transmitted which changes the channel on an automatic television set, while by pushing another key, the user may cause the audio volume to be raised or lowered. It is also possible to program the remote control 10 so that depressing a combination of the keys 20a, 20b, 20c, 20d, 22a, 22b at the same time will generate a different signal transmission than is generated by depressing single ones of the keys 20a, 20b, 20c, 20d, 22a, 22b.

The keys 20a, 20b, 20c, 20d, 22a, 22b further advantageously program circuitry within the remote control 10 while in a "LEARN" mode. The LEARN mode, as well as the programming function of the keys 20a, 20b, 20c, 20d, 22a, 22b, will be explained in greater detail with reference to FIG. 4 below. It should be noted that the arrangement of the keys 20a, 20b, 20c, 20d, 22a, 22b shown here is not restrictive, and that other arrangements (e.g., 10-key pad, etc.) can easily be used in accordance with the present invention.

Figure 3:
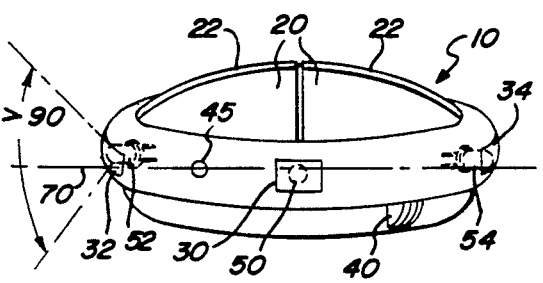
FIG. 3 is an elevational side view of the remote control along a horizontal plane.

The signal transmission ports 30, 32, 34, 36 are constructed and arranged to provide omnidirectional transmission of control signals. As shown in FIG. 2, the ports 30, 32, 34, 36 are spaced at 90° intervals along two orthogonal axes around the outer circumference of the remote control 10, juxtaposed corresponding LED's 50, 52, 54, 56 (shown in hidden lines) located within the remote control 10 adjacent to each of the ports 30, 32, 34, 36. The LED's 50, 52, 54, 56 emit light in the infrared frequency spectrum in response to signals from control circuitry 100 (FIG. 5) within the remote control 10. In the preferred embodiment, the transmission ports are wide enough to allow the LED's to provide high intensity light over an arc $\beta$ of at least 90°. This assures that the infrared signal transmitted by the remote control 10 will be broadcast over a 360° arc, or effectively in all directions along the horizontal plane, from the remote control 10. The transmission ports are also formed so that signals from the LED's are propagated along the vertical plane as well as the horizontal plane. FIG. 3 is an elevational side view of the remote control 10 which more clearly indicates the range over which the infrared LED's transmit light signals in the vertical plane. A centerline 70 indicates the position of the horizontal plane of the remote control 10. As can be seen from FIG. 3, the signals transmitted from the LED's also extend vertically into space, and advantageously cover an arc range of at least 90° in the vertical plane. Thus, a donut-shaped transmission region is effectively created. Although not shown, transmitting LED's may also be placed on top and bottom of the remote control 10 so that signals are transmitted throughout the regions directly above and below the remote control 10 to create a substantially spherical transmission region.

A significant feature of remote control units constructed in accordance with the present invention is that the user does not need to orient the remote control 10 in a particular direction to insure proper transmission of a control signal to a receiver within the remote television set. In addition to this, the omnidirectional remote control 10 overcomes certain problems associated with objects within the line of sight between the remote control 10 and a receiver, since the omnidirectional signal transmission increases the likelihood of signals being bounced off of objects or walls and reflected towards the receiver.

Figure 5:
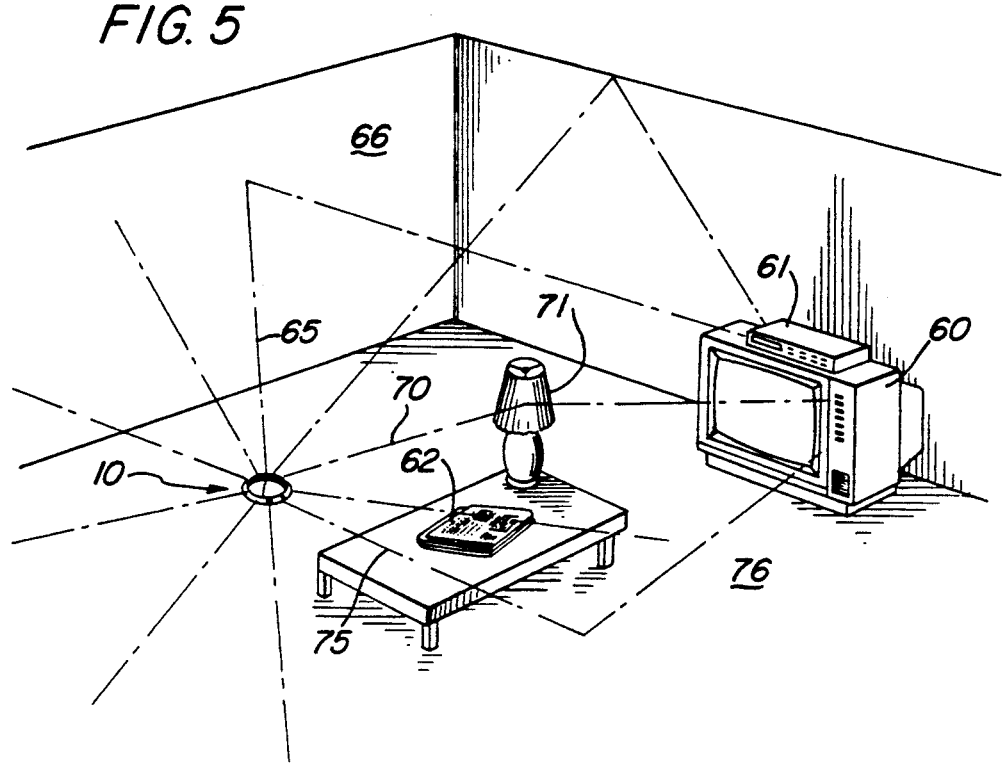
FIG. 5 is a perspective drawing showing the manner in which the invention uses reflected energy to remotely control a unit which is not in direct line-of-light.
Figure 6:
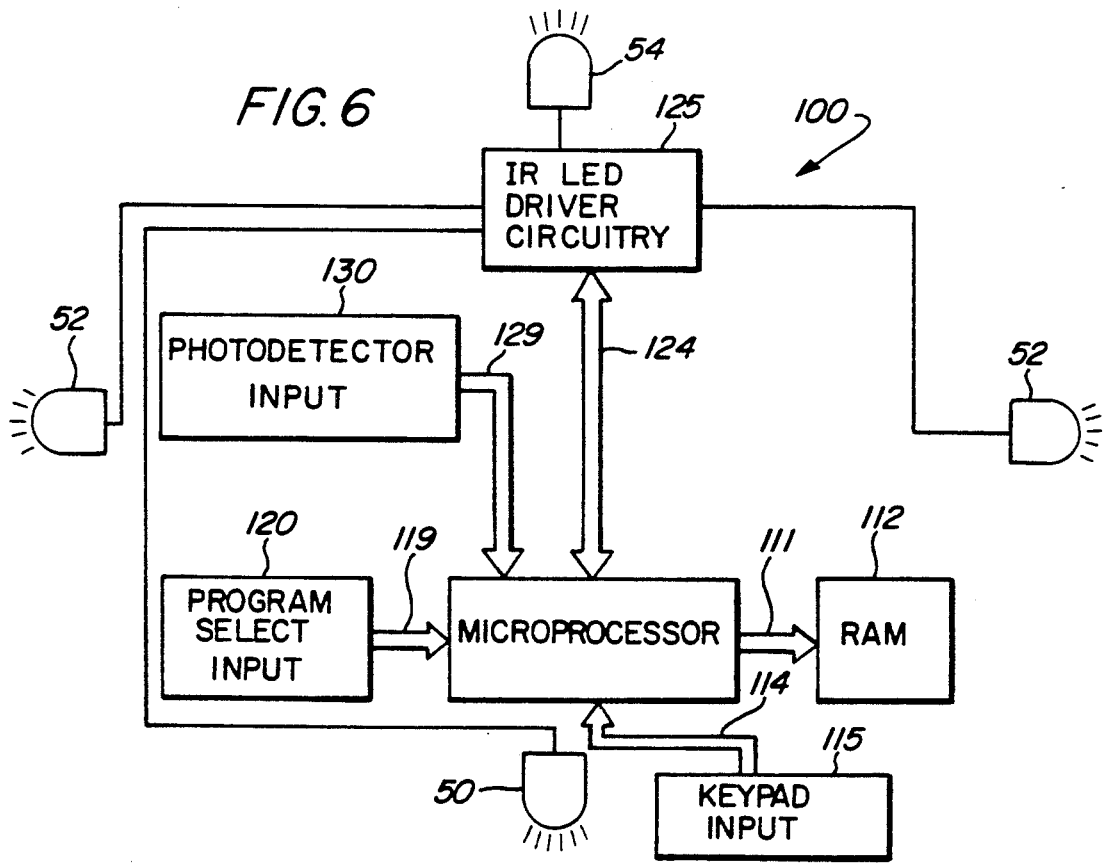
FIG. 6 is a functional block diagram of the control circuitry within the remote control.

As shown in FIG. 5, the remote control 10 radiates energy through a 360° arc to create a donut-shaped transmission region between the control 10 and the remotely controlled television 60 and CD player 61. In the drawing, a direct line-of-sight path between control 10 and the receiver within television 60 and CD player 61 is obstructed by newspaper 62. However, the user of control 10 will not be affected by this since the radiated energy has several reflected paths. One such path 65 is reflected off the room wall 66. Another path 70 is reflected off a glass table top 75. Still another path 78 is reflected off the floor 76. In this manner, in practically any room situation, the remote control is always in control of the remote electronic device. As a result, the user may nonchalantly control CD player 61 with unit 10 without giving a thought that his newspaper is blocking a line-of-sight path.

Figure 4:
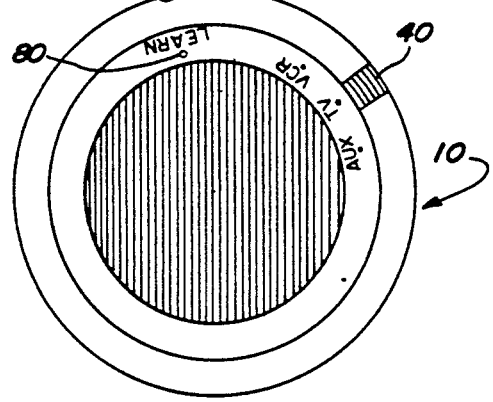
FIG. 4 is a bottom plan view of the remote control which shows the available program selections.

The program select switch 40 is used to select one of several different transmission modes so that the remote control 10 may be used with a number of different electrically controllable devices. FIG. 4 is a bottom view of the remote control 10 which shows the different transmission modes of the remote control 10. In one embodiment, the remote control 10 may be used to control a television set, a video cassette recorder (VCR) and an auxiliary device (e.g., a stereo system). By moving the program select switch 40 to the desired location, the appropriate mode for controlling the listed device is enabled. For example, the T.V. mode may be selected so that the remote control 10 can be used to control volume, change channels, vary screen intensity and so on.

The remote control 10 also has a LEARN mode which allows the remote control 10 to assimilate the functions of several remote control devices into one convenient system. As shown in FIG. 4, a button 80 labeled "LEARN" is included on the bottom of the remote control 10. By depressing the button 80 (using a pen, toothpick, or the like) the remote control is switched to the LEARN mode. Within the learn mode, the remote control 10 can be programmed to mimic the signals emitted by other remote control devices, and thereby assume their functions and capabilities. To operate the remote control 10 within the LEARN mode, the button 80 is first depressed. Once the button 80 has been depressed, one of the keys 20a, 20b, 20c, 20d is illuminated, and begins to flash on and off. The user then pushes the key, or combination of keys 20a, 20b, 20c, 20d, 22a, 22b that are desired to be programmed. This causes two of the keys 20a, 20b, 20c, 20d to flash. Finally, the transmitter of the other remote control device is placed against the photo-receptor port 45, and a button, which causes the transmission of the function it is desired to mimic, is pushed on the other remote control device. Once the remote control 10 receives the signal transmitted from the other remote control device, a third key 20 begins to flash, thereby indicating that the desired function has been "learned." Thus, each time that the newly programmed key or keys 20a, 20b, 20c, 20d, 22a, 22b are pushed, they will perform the same function as the corresponding key on the other remote control device.

FIG. 5 is a functional block diagram of the control circuitry 100 within the remote control 10. The control circuitry 100 comprises a microprocessor 110, which is electrically connected to an optional random access memory (RAM) 112 via a line 111. The microprocessor 110 receives input from a keypad input 115 via a line 114, as well as a program select input 120 via a line 119. The microprocessor 110 is also connected to LED driver circuitry 125 via a line 124, and photodetector input circuitry 130 via a line 129.

The microprocessor 110 may be one of a plurality of commercially available low-voltage, low-current models, and is advantageously an 8-bit microprocessor. The RAM 112 is optional, depending upon the model of microprocessor chosen, since many models have internal memories. The RAM 112 may be used to store data relating to the "learned" transmission functions. The keypad input 115 is directly connected to the keys 20a, 20b, 20c, 20d, 22a, 22b, and transmits signals to the microprocessor 110 indicating which of the keys 20a, 20b, 20c, 20d, 22a, 22b are depressed. The program select input 120 is connected to the program selector 40 and sends signals to the microprocessor 110 indicating the selected transmission mode. The program select input 120 also transmits signals to the microprocessor 110 which indicate that the button 80 has been depressed to switch to the LEARN mode. The photodetector input circuitry 130 is conventional, and is used to receive signals transmitted by other remote control devices while the LEARN mode is enabled via the photo-receptor port 45. The received signals are then relayed to the microprocessor 110. These signals are then copied and stored as digital representations within the RAM 112.

The microprocessor 110 outputs control signals to the IR LED driver circuitry 125 in response to input signals from the keypad input 115, and the program select input 120. These control signals may be pre-programmed into the microprocessor 110, or may be retrieved from the RAM 112. The control signals are then used to drive the LED's 50, 52, 54, 56, which convert the signals to IR radiation and transmit the converted signals to the receiver of the appropriate remotely controlled apparatus. The microprocessor 110 may also be employed to control the flashing of the keys 20a, 20b, 20c, 20d while in the LEARN mode. It should be noted that the program select input 120, the RAM 112, and the IR LED driver circuitry 125 may all be implemented as circuitry internal to microprocessor 110.

It should be noted that the invention may be embodied in other specific forms without departing from its spirit or essential characteristics. Thus, the foregoing description of the invention should be considered as illustrative and not restrictive. For example, the remote control 10 may be rectangularly formed, having an IR LED on each side or each corner. Also, it is possible that more than four LED's could be provided around the perimeter of the remote control 10. Therefore, the scope of the invention is indicated by the appended claims rather than by the foregoing description. All changes which come within the meaning and range of equivalency of the claims are to be embraced within their scope.

What is claimed is:

1. A small, hand-held remote control device to remotely control a television set or the like in which the control function is not determined by the angular orientation of the device with respect to the television set, said device comprising:

a case having a generally partial oblate spheroid outer configuration;

a plurality of infrared signal emitters fixedly mounted within said case;

a plurality of ports in the walls of said case, each port in juxtaposition with a respective emitter of said infrared signal emitters;

a plurality of control keys located in the upper surface of said case;

means within said case responsively coupled to said keys for generating control signals for said television set or the like; and means for coupling said control signals to all of said infrared signal emitters so that each of said emitters simultaneously transmits identical infrared signals to the outside of said case, each of said signal emitters having an angular band of radiation $\beta$ such that the sum of all $\beta$'s is approximately 360° or greater so that said control signals are broadcast from said device by omnidirectional infrared signals.

2. A small, hand-held remote control device to remotely control a television set or the like in which the control function is not determined by the angular orientation of the device with respect to the television set, said device comprising:

a case having a generally partial oblate spheroid outer configuration;

a plurality of infrared signal emitters fixedly mounted within said case along two substantially orthogonal axes;

a plurality of ports in the walls of said case, each port in juxtaposition with a respective emitter of said infrared signal emitters;

a plurality of control keys located in the upper surface of said case;

means within said case responsively coupled to said keys for generating control signals for said television set or the like; and means for coupling said control signals to all of said infrared signal emitters so that each of said emitters simultaneously transmits identical infrared signals to the outside of said case, each of said signal emitters having an angular band of radiation $\beta$ such that the sum of all $\beta$'s is approximately 360° or greater so that said control signals are broadcast from said device by omnidirectional infrared signals of approximately 90°.

3. A small, hand-held remote control device to remotely control a television set or the like in which the control function is not determined by the angular orientation of the device with respect to the television set, said device comprising:

a case having a generally disc-like outer configuration;

a plurality of infrared signal emitters fixedly mounted within said case;

a plurality of ports in the walls of said case, each port in juxtaposition with a respective emitter of said infrared signal emitters;

a plurality of control keys located in the upper surface of said case;

means within said case responsively coupled to said keys for generating control signals for said television set or the like; and means for coupling said control signals to all of said infrared signal emitters so that each of said emitters simultaneously transmits identical infrared signals to the outside of said case, each of said signal emitters having an angular band of radiation $\beta$ such that the sum of all $\beta$'s is approximately 360° or greater so that said control signals are broadcast from said device by omnidirectional infrared signals.

4. A small, hand-held remote control device to remotely control a television set or the like in which the control function is not determined by the angular orientation of the device with respect to the television set, said device comprising:

a plurality of infrared signal emitters fixedly mounted within said device;

a plurality of ports in the walls of said device, each port in juxtaposition with a respective emitter of said infrared signal emitters;

a plurality of control keys located on said device;

means responsively coupled to said keys for generating control signals for said television set or the like; and means for coupling said control signals to said plurality of infrared signal emitters so that said control signals are broadcast substantially omnidirectionally from said device.

5. The method of remotely controlling a television set or the like from a remote location substantially independently of both (i) the angular orientation with respect to the set; and (ii) there being a line-of-sight path between said set and said remote location, said method comprising the steps of:

selectively generating a control corresponding to a particular function for said television set or the like at said remote location;

transmitting from said remote location a plurality of identical coded infrared signals corresponding to said control signal along two substantially orthogonal axes;

reflecting a portion of said coded infrared signals off of a surface located between said remote location and said television set or the like; and receiving at said television set or the like a reflected infrared signal from said surface.

6. A small, hand-held remote control device to remotely control a consumer electronic device, said device comprising:

a plurality of infrared signal emitters fixedly mounted within said device;

a plurality of ports in the walls of said device, each port in juxtaposition with a respective emitter of said infrared signal emitters;

a plurality of control keys located in said device;

means responsively coupled to said keys for generating control signals corresponding to particular functions of said consumer electronic device; and means for coupling said control signals to said plurality of infrared signal emitters so that said control signals are broadcast substantially omnidirectionally from said device.

7. A small, hand-held remote control device to remotely control a consumer electronic device, said device comprising:

a plurality of signal radiation emitters fixedly mounted within said device;

a plurality of control keys located in said device;

means responsively coupled to said keys for generating control signals corresponding to functions of said consumer electronic device; and means for coupling said control signals to said plurality of signal radiation emitters so that said control signals are broadcast substantially omnidirectionally from said device.

8. A small, hand-held remote control device to remotely control a television set or the like in which the control function is not determined by the angular orientation of the device with respect to the television set, said device comprising:

a case having a generally partial oblate spheroid outer configuration;

a plurality of signal radiation emitters fixedly mounted within said case;

a plurality of ports in the walls of said case, each port in juxtaposition with a respective emitter of said signal radiation emitters;

a plurality of control keys located in the upper surface of said case;

means within said case responsively coupled to said keys for generating control signals for said television set or the like; and means for coupling said control signals to all of said signal radiation emitters so that each of said emitters simultaneously transmits identical radiation signals to the outside of said case, each of said signal emitters having an angular band of radiation $\beta$ such that the sum of all $\beta$'s is approximately 360° or greater so that the radiation signals are broadcast omnidirectionally from said device.

* * * * *